United States Patent
Chen

(10) Patent No.: US 6,714,034 B2
(45) Date of Patent: Mar. 30, 2004

(54) INTEGRATED CIRCUIT TESTING APPARATUS HAVING STABLE GROUND REFERENCE

(76) Inventor: Andy Chen, No. 83, Tung Kuang Rd., Hsin Chu City (TW)

( * ) Notice: Subject to any disclaimer, the term of this patent is extended or adjusted under 35 U.S.C. 154(b) by 0 days.

(21) Appl. No.: 10/119,736

(22) Filed: Apr. 11, 2002

(65) Prior Publication Data

US 2003/0193343 A1 Oct. 16, 2003

(51) Int. Cl.[7] ................................................ G01R 31/26
(52) U.S. Cl. ..................................... 324/765; 324/158.1
(58) Field of Search ................................. 324/754–758, 324/761–762, 765, 158.1; 439/66, 92, 95, 98, 108, 497; 438/17–18

(56) References Cited

U.S. PATENT DOCUMENTS

| | | | | | |
|---|---|---|---|---|---|
| 4,965,865 A | * | 10/1990 | Trenary | ...................... | 324/754 |
| 5,304,921 A | * | 4/1994 | Cook et al. | .................. | 324/758 |
| 5,956,567 A | * | 9/1999 | Tomita | .......................... | 438/18 |
| 5,967,848 A | * | 10/1999 | Johnson et al. | ............. | 439/620 |

* cited by examiner

Primary Examiner—Vinh P. Nguyen
Assistant Examiner—Minh N. Tang
(74) Attorney, Agent, or Firm—Rosenberg, Klein & Lee

(57) ABSTRACT

An IC testing apparatus includes a testing board having at least one testing region and a plurality of signal grounds thereon, and at least one inductive magnetic device. The testing apparatus is for generating a new DUT reference ground by connecting the inductive magnetic device with the signal ground of the testing region.

3 Claims, 3 Drawing Sheets

INTEGRATED CIRCUIT TESTING APPARATUS HAVING STABLE GROUND REFERENCE

BACKGROUND OF THE INVENTION

1. Field of the Invention

The present invention relates to the field of integrated circuit testing, and more particularly, to a DUT (device under test) testing apparatus having a digital signal ground, which is connected to at least one inductive magnetic device to generate a new reference ground.

2. Description of the Prior Art

Semiconductor testing of ICs or chips is required at various stages during the fabrication process. Each IC has to be individually tested no matter it is in a wafer or is packaged to ensure that it functions as the intended. The demand for testing products is driven by two considerations of new chip designs and higher unit volumes. As chips become increasingly powerful and complicated, the need for high-speed and accurate testing becomes more and more important than ever.

A testing board is used to interface the test head to a device-under-test (DUT) socket. Typically, a number of DUTs may be disposed on the testing board at the same time. FIG. 1 is a schematic diagram exemplarily showing the configuration of a prior art testing board. Typically, as shown in FIG. 1, a batch of DUTs mounted on the testing board share a common data ground, including a digital signal ground DG and analog signal ground AG.

However, one drawback of such configuration is that the DUT testing accuracy is reduced when the digital signal ground DG of a DUT is interfered due to noises, which further affect the analog signal ground AG. The interfered DUT affects another DUT since the digital data ground is shared with each other. Consequently, there is a need to provide an IC testing system capable of increasing the testing accuracy and reducing noise interferences among DUTs.

SUMMARY OF THE INVENTION

It is a primary object of the present invention to provide an IC testing apparatus for accurately testing devices.

According to the claimed invention, the testing apparatus includes a testing board having at least one testing region and a plurality of signal grounds thereon, and at least one inductive magnetic device. A DUT (device under test) reference ground is created by connecting the inductive magnetic device with the signal grounds of the testing region.

It is to be understood that both the forgoing general description and the following detailed description are exemplary, and are intended to provide further explanation of the invention as claimed. Other advantages and features of the invention will be apparent from the following description, drawings and claims.

DETAILED DESCRIPTION OF THE PREFERRED EMBODIMENT

Figure 1:
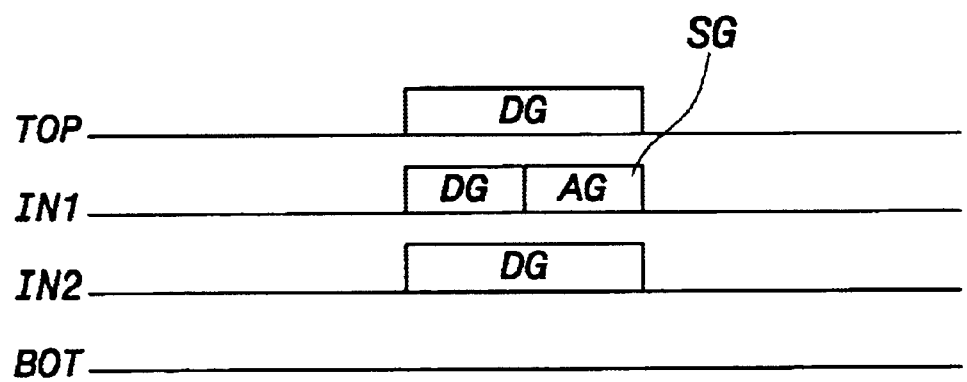
FIG. 1 is a schematic diagram exemplarily showing the configuration of a prior art testing board.
Figure 2:
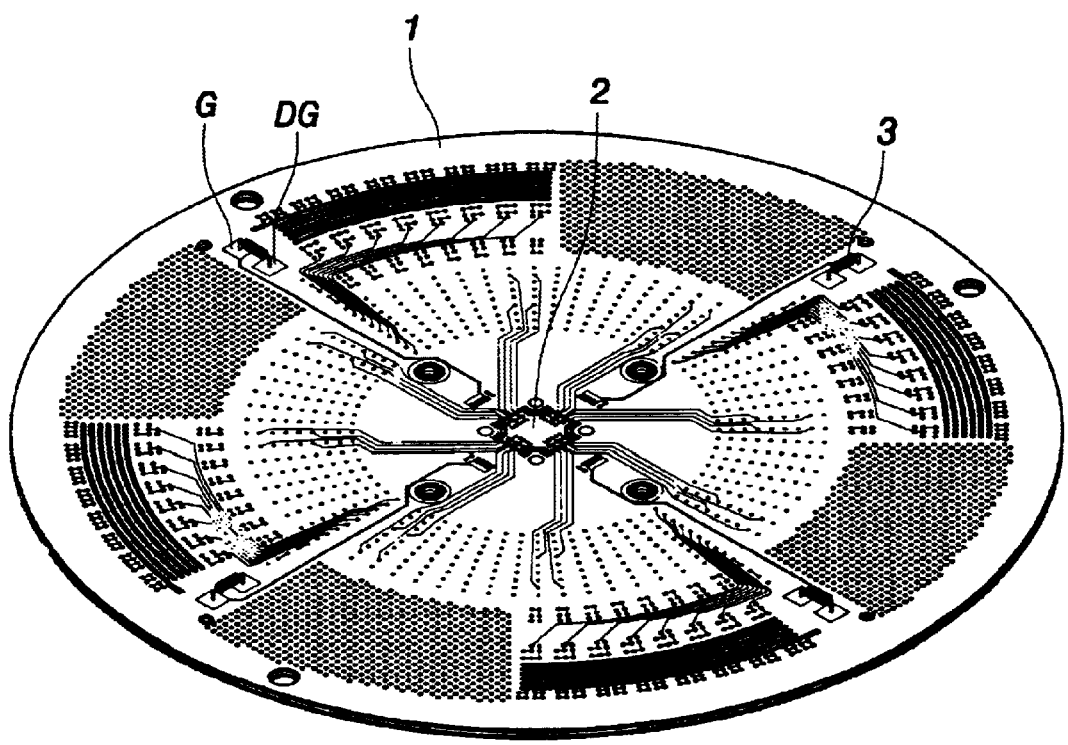
FIG. 2 is a diagram depicting arrangement of a testing board according to one preferred embodiment of this invention.

Referring to FIG. 2, there is shown a diagram depicting an arrangement of a testing board 1 according to one preferred embodiment of this invention. As shown in FIG. 2, a testing region 2 is provided, in accordance with the preferred embodiment, the testing beard includes four inductive magnetic devices 3 mounted on the testing board. The testing region 2 is located at the center of the testing board. The testing region 2 has its own digital signal ground (DG) and a reference ground G. The reference ground G is a new reference ground created by connecting the digital signal ground DG of the testing region 2 and these four inductive magnetic devices 3 serially. The inductive magnetic device 3 may be a choking coil, ferrite bead, or the like. The new reference groiznd is an independent ground or, preferably, a multi-ground.

Figure 3:
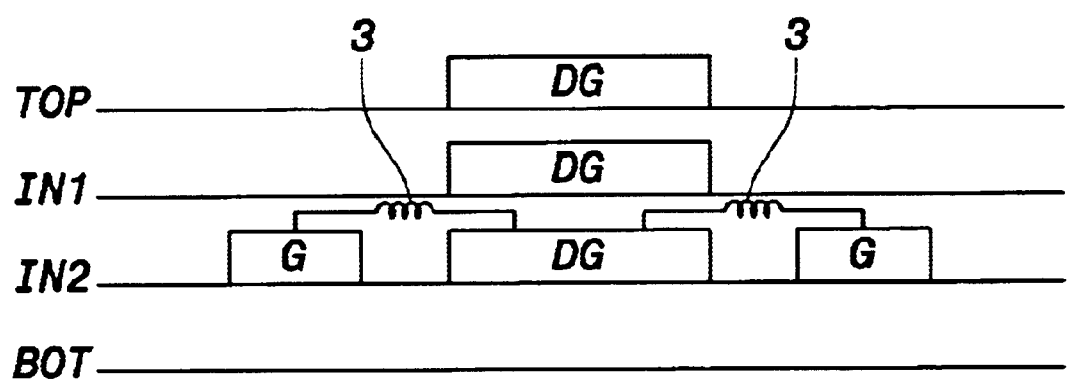
FIG. 3 is a cross-sectional, schematic view illustrating a testing board structure according to this invention.

FIG. 3 is a cross-sectional, schematic diagram conceptually showing the testing board structure of FIG. 2 according to the present invention. In this embodiment, an exemplary four-layer testing board is demonstrated. Note that this invention is not limited to four-layer testing boards. As shown in FIG. 3, a reference ground digital signal ground DG is disposed on a copper-coating surface within the testing region 2 of the second plate (IN1). On the third plate (IN2), a DUT digital signal ground DG and a DUT reference ground G are disposed on a copper-coating surface within the testing region 2. To generate a new reference ground, the digital signal ground DG is serially connected with at least one inductive magnetic device 3.

From FIG. 3, an original analog ground of the testing region 2 is replaced with the newly-generated DUT reference ground. Under this configuration, even when the digital signal ground DG of the testing region 2 is interfered by noises, the reference ground will be affected by these noises to a nearly minimum degree because the inductive magnetic device 3 is capable of filtering AC signals, thereby improving testing accuracy.

In summary, it is advantageous to use the invention since a new reference ground is provided by connecting an inductive magnetic device with the original digital signal ground of the testing region, which is much more noise-resistant in comparison with prior arts and thus leads to improved testing accuracy. Note that this invention is not limited to testing board described in FIG. 2. Other testing board such as burn-in board is also suitable for implementing the claimed invention.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An integrated circuit testing apparatus having a stable ground reference comprising:

a testing board including at least one testing region defined thereon, said testing region having at least a first signal ground and a second signal ground formed thereon; and, at least one inductive magnetic device connected between said first and second signal grounds, said first signal ground forming a reference ground for connection to a device under test.

2. The integrated circuit testing apparatus of claim 1 wherein at least one of said first and second signal grounds is of a type selected from the group consisting of: an independent ground type and a multiple-ground type.

3. The integrated circuit testing apparatus of claim 1 wherein said magnetic device is selected from the group consisting of: a choking coil and a ferrite bead.

* * * * *